United States Patent [19]
Chiou

[11] Patent Number: 5,755,276
[45] Date of Patent: May 26, 1998

[54] CPU HEAT SINK FASTENER

[76] Inventor: Ming Chin Chiou, No. 2, Alley 1, Lane 160, Kai De St., Chien Chen Chu, Kau Hsiung, Taiwan

[21] Appl. No.: 872,167

[22] Filed: Jun. 10, 1997

[51] Int. Cl.⁶ .................................................. H05K 7/20
[52] U.S. Cl. ........................ 165/80.3; 361/704; 257/719
[58] Field of Search ............................ 165/80.3, 185; 174/16.3; 361/697, 704; 257/718, 719

[56] References Cited

U.S. PATENT DOCUMENTS

| | | | |
|---|---|---|---|
| 5,019,940 | 5/1991 | Clemens | 361/386 |
| 5,109,317 | 4/1992 | Miyamoto et al. | 361/386 |
| 5,436,798 | 7/1995 | Wieland, Jr. | 361/710 |
| 5,486,981 | 1/1996 | Blomquist | 361/704 |
| 5,602,719 | 2/1997 | Kinion | 361/704 |
| 5,684,676 | 11/1997 | Lin | 361/704 |

*Primary Examiner*—Allen J. Flanigan
*Attorney, Agent, or Firm*—Bacon & Thomas

[57] ABSTRACT

A CPU heat sink fastener including two symmetrical locating plates which have a respective downward rear section respectively coupled to two ribs at two opposite sides of a CPU mount, a respective horizontal middle section attached to a top side of a heat sink above a CPU in the CPU mount, and a respective upward front section respectively attached to upright fins of the heat sink at two opposite sides, and a shoulder bolt inserted through a circular through hole at the upward front section of one locating plate and threaded into a screw hole at the upward front section of the other locating plate to pull the locating plates and the heat sink tightly together.

2 Claims, 3 Drawing Sheets

5,755,276

CPU HEAT SINK FASTENER

BACKGROUND OF THE INVENTION

The present invention relates to a CPU heat sink fastener adapted for fastening to two ribs at both sides of a CPU mount to clamp a heat sink against a CPU in the CPU mount, for permitting heat to be quickly dissipated from the CPU into the air through the heat sink.

A variety of heat sinks have been disclosed for quick dissipation of heat from a CPU. When a heat sink is installed, it must be secured in place so that it can be firmly retained in close contact with the CPU for quick dissipation of heat. Regular CPU heat sink fasteners are commonly designed to fit a particular CPU mount. Therefore, different sizes of CPU heat sink fasteners shall be used to fit different sizes of CPU mounts. Further, the springy material property of regular CPU heat sink fasteners may cause them to disconnect from the CPU mount when vibrated.

SUMMARY OF THE INVENTION

It is one object of the present invention to provide a CPU heat sink fastener which can positively secure a heat sink to a CPU mount, permitting heat to be quickly dissipated from a CPU in the CPU mount into the air through the heat sink. It is another object of the present invention to provide a CPU heat sink fastener which is easy to install. It is still another object of the present invention to provide a CPU heat sink fastener which can be conveniently dismounted for quick replacement of the heat sink. To achieve these and other objects of the present invention, there is provided a CPU heat sink fastener which is comprised of two symmetrical locating plates, which have a respective downward rear section respectively coupled to two ribs at two opposite sides of a CPU mount, a respective horizontal middle section attached to a top side of a heat sink above a CPU in the CPU mount, and a respective upward front section respectively attached to upright fins of the heat sink at two opposite sides, and a shoulder bolt inserted through a circular through hole at the upward front section of one locating plate and threaded into a screw hole at the upward front section of the other locating plate to pull the locating plate and the heat sink tightly together.

DETAILED DESCRIPTION OF THE PREFERRED EMBODIMENT

Figure 1:
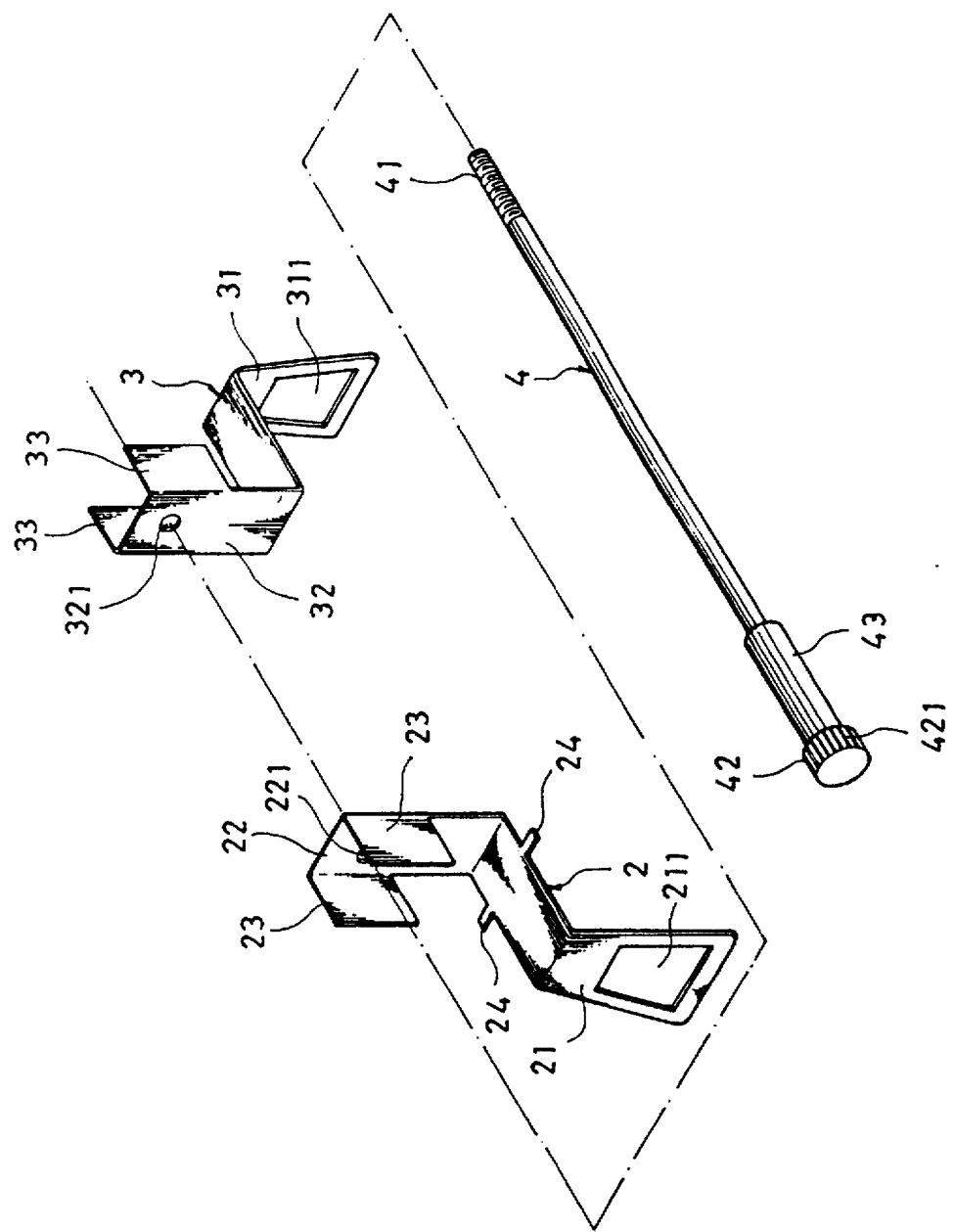
FIG. 1 is an exploded view of a CPU heat sink fastener according to the present invention.

Referring to FIG. 1, a CPU heat sink fastener in accordance with the present invention is generally comprised of a first locating plate 2, a second locating plate 3, and a shoulder bolt 4.

The first locating plate 2 comprises a downward rear section 21 and an upward front section 22 perpendicularly raised from two opposite ends of a horizontal middle section thereof in reversed direction, a coupling hole 211 at the downward rear section 21, two horizontal wings 24 bilaterally extended from the horizontal middle section, two reinforcing ribs 23 respectively raised from two lateral sides of the upward front section 22 at right angles, and a circular through hole 221 at the upward front section 22. The second locating plate 3 comprises a downward rear section 31 and an upward front section 32 perpendicularly raised from two opposite ends of a horizontal middle section thereof in reversed direction, a coupling hole 311 at the downward rear section 31, two reinforcing ribs 33 respectively raised from two lateral sides of the upward front section 32 at right angles, and a screw hole 321 at the upward front section 32. The shoulder bolt 4 comprises a threaded rod 41 at one end, a head 42 with peripheral grooves 421 at an opposite end, and a shoulder 43 extended from the head 42. The diameter of the shoulder 43 is slightly greater than the circular through hole 221.

Figure 2:
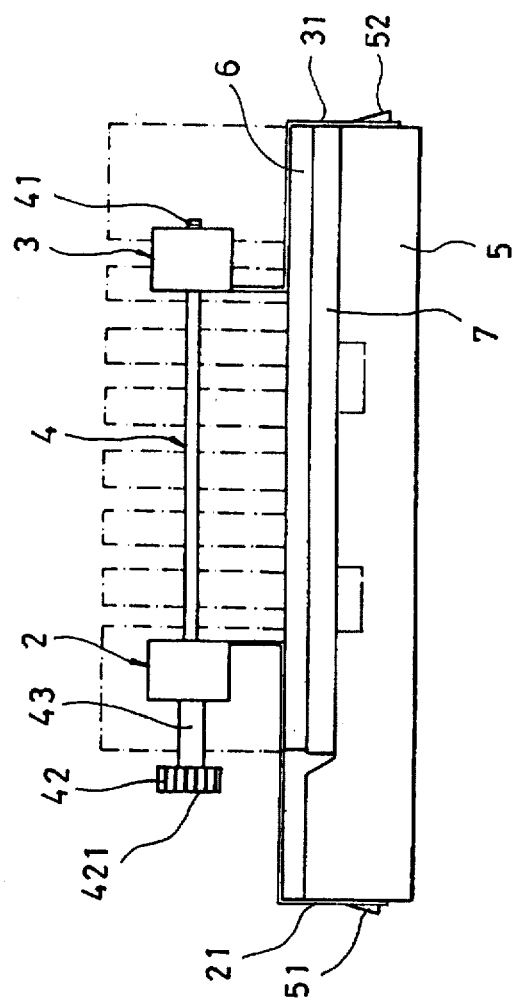
FIG. 2 is an applied view of the present invention, showing the CPU heat sink fastener installed.
Figure 3:
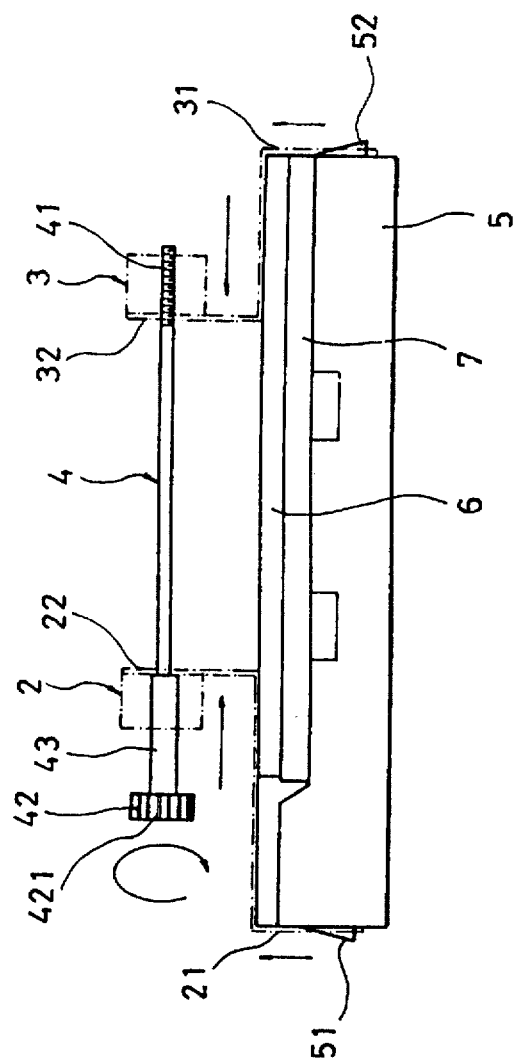
FIG. 3 is similar to FIG. 2 but showing the screw rod fastened tightly.

Referring to FIGS. 2 and 3, the coupling holes 211;311 of the downward rear sections 21;31 of the locating plates 2;3 are respectively coupled to respective ribs 51;52 at both sides of the CPU mount 5, permitting the horizontal middle sections of the locating plates 2;3 to be closely attached to the top surface of the heat sink 6 above the CPU 7 and the horizontal wings 24 inserted into gaps in the heat sink 6, and then the threaded rod 41 of the shoulder bolt 4 is inserted through the circular through hole 221 of the first locating plate 2 and threaded into the screw hole 321 of the second locating plate 3. Because the shoulder 43 of the shoulder bolt 4 is stopped at the upward front section 22 of the first locating plate 2, when the shoulder bolt 4 is continuously threaded inwards, the first locating plate 2 and the second locating plate 3 are pulled toward each other and firmly secured to the fins of the heat sink 6, and at the same time the downward rear sections 21;31 of the locating plates 2;3 are pulled upwards, causing the horizontal middle sections of the locating plates 2;3 to increase their downward pressure to the heat sink 6 against the CPU 7, and therefore the heat sink 6 is firmly secured to the CPU mount 5 to efficient dissipate heat from the CPU 7.

When turning the shoulder bolt 4 in the reversed direction, the threaded rod 41 of the shoulder bolt 4 is disengaged from the screw hole 321 of the second locating plate 3, and therefore the locating plates 2;3 can be easily removed from the heat sink 6 and the CPU mount 5.

While only one embodiment of the present invention has been shown and described, it will be understood that various modifications and changes could be made thereunto without departing from the spirit and scope of the invention disclosed.

What the invention claimed is:

1. A CPU heat sink fastener fastened to two ribs at both sides of a CPU mount to hold down a heat sink above a CPU in said CPU mount, comprising:

a first locating plate having a horizontal middle section closely attached to said heat sink at a top side, a downward rear section extended from one end of the horizontal middle section of said first locating plate at right angles and closely attached to one side of said CPU mount, a coupling hole at the downward rear section of said first locating plate and coupled to one rid of said CPU mount, two horizontal wings bilaterally extended from the horizontal middle section of said first locating plate and inserted into respective hole in said heat sink, an upward front section extended from one end of the horizontal middle section of said first locating plate and closely attached to upright fins of said heat sink, two reinforcing ribs respectively raised from two lateral sides of the upward front section of said first locating plate at right angles, and a circular through hole at the upward front section of said first locating plate;

a second locating plate having a horizontal middle section closely attached to said heat sink at a top side, a downward rear section extended from one end of the horizontal middle section of said second locating plate at right angles and closely attached to one side of said CPU mount, a coupling hole at the downward rear section of said second locating plate and coupled to one rid of said CPU mount, an upward front section extended from one end of the horizontal middle section of said second locating plate and closely attached to upright fins of said heat sink, two reinforcing ribs respectively raised from two lateral sides of the upward front section of said second locating plate at right angles, and a screw through hole at the upward front section of said second locating plate; and a shoulder bolt having a head with peripheral grooves at one end adapted for turning with the fingers, a threaded rod at an opposite end inserted through the circular through hole of the upward front section of said first locating plate and threaded into the screw hole of the upward front section of said second locating plate, and a shoulder extended from said head and stopped at one side of the upward front section of said first locating plate opposite to said second locating plate.

2. The CPU heat sink fastener of claim 1, wherein the shoulder of said shoulder bolt has an outer diameter smaller than said head but greater than the circular through hole of the upward front section of said first locating plate.

\* \* \* \* \*